(12) United States Patent
Lee et al.

(10) Patent No.: US 9,384,804 B1
(45) Date of Patent: Jul. 5, 2016

(54) SEMICONDUCTOR DEVICE AND SEMICONDUCTOR SYSTEM

(71) Applicant: SK hynix Inc., Icheon-si Gyeonggi-do (KR)

(72) Inventors: Sung Yub Lee, Icheon-si (KR); Geun Il Lee, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/718,190

(22) Filed: May 21, 2015

(30) Foreign Application Priority Data

Mar. 2, 2015 (KR) .......................... 10-2015-0029344

(51) Int. Cl.
*G11C 5/14* (2006.01)
*G11C 7/22* (2006.01)
*G11C 7/06* (2006.01)
*G11C 7/10* (2006.01)
*G11C 29/04* (2006.01)

(52) U.S. Cl.
CPC *G11C 7/22* (2013.01); *G11C 5/147* (2013.01); *G11C 7/06* (2013.01); *G11C 7/10* (2013.01); *G11C 29/04* (2013.01)

(58) Field of Classification Search
CPC .............. G11C 5/14; G11C 7/06; G11C 7/10; G11C 7/12; G11C 7/22; G11C 29/02; G11C 29/04; G11C 29/80

USPC .......... 365/189.05, 189.09, 194, 226, 230.06, 365/185.21, 207, 200, 201
See application file for complete search history.

(56) References Cited

U.S. PATENT DOCUMENTS

| 6,262,924 B1* | 7/2001 | Fukutani | G11C 8/18 365/200 |
| 6,477,090 B2* | 11/2002 | Yamaki | G11C 11/5628 365/185.21 |
| 8,908,457 B2* | 12/2014 | Furutani | G11C 7/08 365/207 |
| 2012/0275256 A1 | 11/2012 | Furutani | |

FOREIGN PATENT DOCUMENTS

KR    20080080696 A    9/2008

\* cited by examiner

*Primary Examiner* — Gene Auduong
(74) *Attorney, Agent, or Firm* — William Park & Associates Ltd.

(57) ABSTRACT

A semiconductor system is provided, which includes a controller configured to output an active command and test mode signals; and a semiconductor device configured to sense and amplify a pair of bit lines by generating a first power control signal of which a pulse width is adjusted in accordance with a combination of the test mode signals during an enable period of an enable signal generated by the active command, receiving a supply of a first power according to the first power control signal, and receiving a supply of a second power according to a second power control signal.

28 Claims, 5 Drawing Sheets

SEMICONDUCTOR DEVICE AND SEMICONDUCTOR SYSTEM

CROSS-REFERENCE TO RELATED APPLICATION

The present application claims priority under 35 U.S.C. §119(a) to Korean application number 10-2015-0029344, filed on Mar. 2, 2015, in the Korean Intellectual Property Office, which is incorporated herein by reference in its entirety.

BACKGROUND

1. Technical Field

Embodiments of the invention relate to a semiconductor device and a semiconductor system.

2. Related Art

In general, a memory cell includes one transistor and one capacitor. During read, write, and refresh of such a memory cell, a word line is enabled to make charge that is stored in the capacitor of the memory cell loaded to a bit line, and a signal that is loaded to the bit line is sensed and amplified by a bit-line sense amplifier. Here, the bit line is precharged before the word line is selected. In order to quicken and facilitate amplification, the bit-line sense amplifier is supplied with a power that is driven by a supply voltage having a level that is higher than the level of an internal voltage, and senses and amplifies the bit line, which is called overdriving.

SUMMARY

In an embodiment, a semiconductor system includes a controller configured to output an active command and test mode signals. The semiconductor system also includes a semiconductor device configured to sense and amplify a pair of bit lines by generating a first power control signal of which a pulse width is adjusted in accordance with a combination of the test mode signals during an enable period of an enable signal generated by the active command. The semiconductor device is also configured to receive a supply of a first power according to the first power control signal, and receive a supply of a second power according to a second power control signal.

In an embodiment, a semiconductor device includes a power control signal generation unit configured to generate a first power control signal that includes a first pulse generated according to an enable signal enabled during a write operation and a second pulse generated in accordance with a combination of a column selection signal and a test mode signal generated during the write operation. The power control signal generation unit is also configured to generate a second power control signal enabled after a predetermined time point from a time point when the enable signal is generated. The semiconductor device also includes a sense amplifying circuit configured to sense and amplify a pair of bit lines by receiving a supply of a first power and a second power according to the first and second power control signals during an enable period of the enable signal.

In an embodiment, a semiconductor device includes a test mode signal generation unit configured to store a plurality of test mode signals and to output the test mode signals during a write operation. The semiconductor device also includes a power control signal generation unit configured to generate a first power control signal that includes a first pulse generated according to an enable signal enabled during the write operation and a second pulse generated in accordance with a combination of a column selection signal and the test mode signals generated during the write operation, and to generate a second power control signal enabled after a predetermined time point from a time point when the enable signal is generated. The semiconductor device also includes a sense amplifying circuit configured to sense and amplify a pair of bit lines by receiving a supply of a first power and a second power according to the first and second power control signals during an enable period of the enable signal.

DETAILED DESCRIPTION

Figure 1:
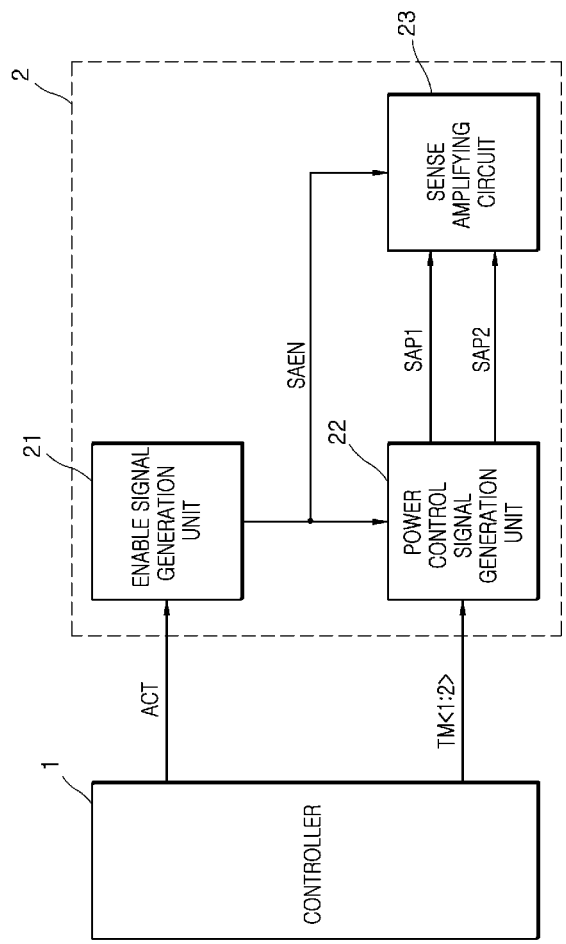
FIG. 1 is a block diagram illustrating the configuration of a semiconductor system in accordance with an embodiment.

Hereinafter, a semiconductor device and a semiconductor system will be described below with reference to the accompanying figures through various embodiments. These embodiments are merely to exemplify the invention, and the right protection scope of the invention is not limited to the embodiments. Various embodiments are directed to a semiconductor system which is provided with a test mode for adjusting a period in which a power is supplied to a sense amplifier, and adjusts an overdriving period. In accordance with the invention, the test mode for adjusting the period in which the power is supplied to the sense amplifier is provided, and the write time can be reduced through adjustment of the overdriving period Referring to FIG. 1, a semiconductor system in accordance with an embodiment may include a controller 1 and a semiconductor device 2. The semiconductor device 2 may include an enable signal generation unit 21, a power control signal generation unit 22, and a sense amplifying circuit 23.

The controller 1 may output an active command ACT and first and second test mode signals TM<1:2>.

The enable signal generation unit 21 may receive an input of the active command ACT. The enable signal generation 21 may generate an enable signal SAEN enabled during a write operation.

The power control signal generation unit 22 may generate a first power control signal SAP1 which includes a first pulse generated when the enable signal SAEN is input. The power control signal generation unit 22 may also generate a second pulse of which a pulse width is adjusted in accordance with a combination of the first and second test mode signals TM<1:2> during the write operation. The power control signal generation unit 22 may also generate a second power control signal SAP2 enabled after a predetermined time point from a generation time point of the enable signal SAEN.

On the other hand, the operation of generating the first power control signal SAP1 which includes the first pulse generated when the enable signal SAEN is input and the second pulse of which the pulse width is adjusted in accordance with the combination of the first and second test mode signals TM<1:2> will be described in detail through the figures to be described later. Further, the operation of generating the second power control signal SAP2 enabled after the predetermined time point from the generation time point of the enable signal SAEN will be described in detail through the figures to be described below.

The sense amplifying circuit 23 may sense and amplify a pair of bit lines BL and BLB (in FIG. 3) by a first power VDD (in FIG. 3) supplied by the first power control signal SAP1 during an enable period of the enable signal SAEN and a second power VCORE (in FIG. 3) supplied by the second power control signal SAP2.

The semiconductor device 2 may generate the first power control signal SAP1 of which the pulse width is adjusted in accordance with the combination of the first and second test mode signals TM<1:2> during the enable period of the enable signal SAEN generated by the active command ACT. The semiconductor device 2 may generate the second power control signal SAP2 after the predetermined time point from the generation time point of the enable signal SAEN. Further, the semiconductor device 2 may sense and amplify the pair of bit lines BL and BLB (in FIG. 3) by the first power VDD (in FIG. 3) supplied by the first power control signal SAP1 and the second power VCORE (in FIG. 3) supplied by the second power control signal SAP2.

Figure 2:
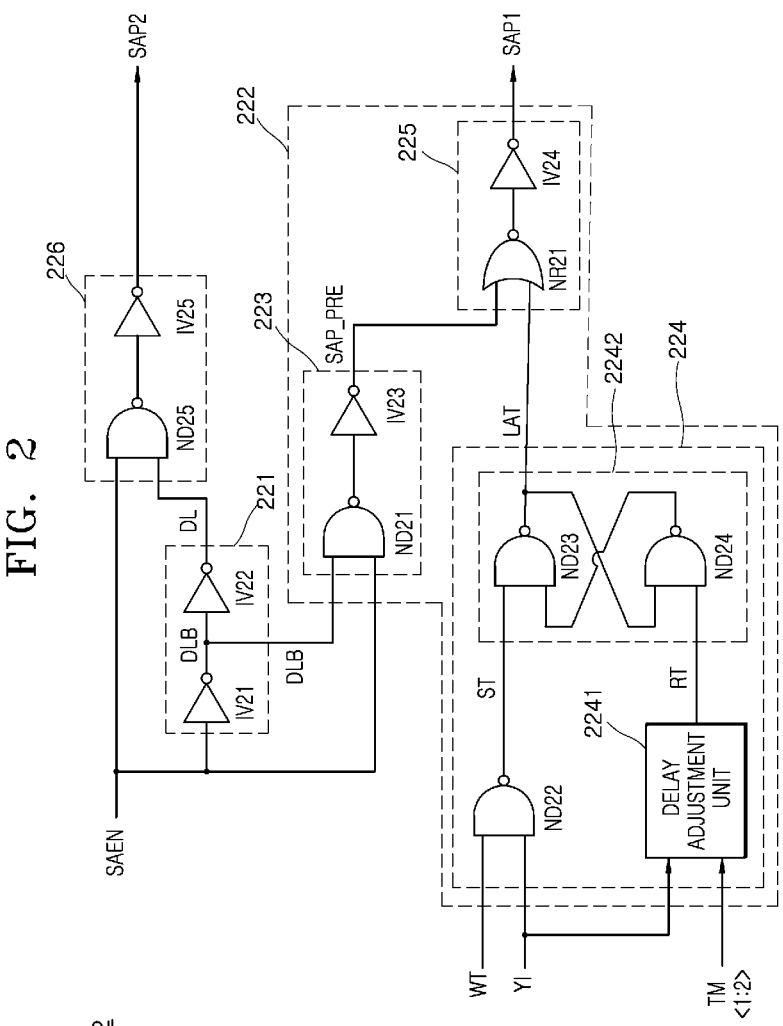
FIG. 2 is a circuit diagram illustrating the configuration of a power control signal generation unit included in the semiconductor system illustrated in FIG. 1.

Referring to FIG. 2, the power control signal generation unit 22 may include a delay unit 221, a first power control signal generation unit 222, and a second power control signal generation unit 226.

The delay unit 221 may include an inverter IV21 that generates an inverted delay signal DLB through inversion delay of the enable signal SAEN. The delay unit 221 may also include an inverter IV22 that generates a delay signal DL through inversion delay of the inverted delay signal DLB. The delay unit 221 may generate the inverted delay signal DLB through the inversion delay of the enable signal SAEN and the delay signal DL through the delay of the enable signal SAEN. Here, in the operation of generating the second power control signal SAP2 enabled after the predetermined time point from the generation time point of the enable signal SAEN as described above, the predetermined time point may be set by delay amounts of the inverters IV21 and IV22 of the delay unit 221 that generates the delay signal DL through the delay of the enable signal SAEN.

The first power control signal generation unit 222 may include a first logic unit 223, a latch signal generation unit 224, and a second logic unit 225.

The first logic unit 223 may include a NAND gate ND21 that NAND-gates the enable signal SAEN and the inverted delay signal DLB. The first logic unit 223 may also include an inverter IV23 that generates a pre-control signal SAP_PRE through inversion delay of an output signal of the NAND gate ND21.

When the enable signal SAEN is generated at a logic high level and the inverted delay signal DLB is generated at a logic high level, the first logic unit 223 may generate the pre-control signal SAP_PRE enabled at a logic high level.

The latch signal generation unit 224 may include a logic element ND22 implemented by a NAND gate that generates a set signal ST through NAND-gating of a write signal WT and a column selection signal YI. The latch signal generation unit 224 may also include a delay adjustment unit 2241 that generates a reset signal RT through delay of the column selection signal YI with a delay amount adjusted in accordance with the first and second test mode signals TM<1:2>. Further, the latch signal generation unit 224 may include a latch unit 2242 including a NAND gate ND23 that generates a latch signal LAT through NAND-gating of the set signal ST and an output signal of the NAND gate ND24 and a NAND gate ND24 that NAND-gates the reset signal RT and the latch signal LAT. The latch signal generation unit 224 may generate the latch signal LAT enabled when the column selection signal YI is input during the write operation and of which a disable time point is adjusted by the delay amount that is set in accordance with the combination of the first and second test mode signals TM<1:2>. Here, the write signal WT may be generated at a logic high level during the write operation and may be generated at a logic low level during a read operation. Further, the column selection signal YI may be set as a signal enabled to store or output data of the memory cell during the write operation and the read operation.

The second logic unit 225 may include a NOR gate NR21 that NOR-gates the pre-control signal SAP_PRE and the latch signal LAT. The second logic unit 225 may also include an inverter IV24 that generates the first power control signal SAP1 through inversion delay of an output signal of the NOR gate NR21. When at least one of the pre-control signal SAP_PRE and the latch signal LAT is generated at a logic high level, the second logic unit 225 may generate the first power control signal SAP1 that is enabled at a logic high level.

The first power control signal generation unit 222 as configured above may generate the first power control signal SAP1 which includes the first pulse generated at a time point when the enable signal SAEN is enabled and the inverted delay signal DLB is enabled and the second pulse enabled at a time point when the column selection signal YI is input during the write operation and of which the pulse width is adjusted in accordance with the combination of the first and second test mode signals TM<1:2>.

The second power control signal generation unit 226 may include a NAND gate ND25 that NAND-gates the enable signal SAEN and the delay signal DL. The second power control signal generation unit 226 may also include an inverter IV25 that generates the second power control signal SAP2 through inversion delay of an output signal of the NAND gate ND25.

The second power control signal generation unit 226 may generate the second power control signal SAP2 that is enabled at a logic high level at a time point when the enable signal SAEN is generated at a logic high level and the delay signal DL is generated at a logic high level.

Figure 3:
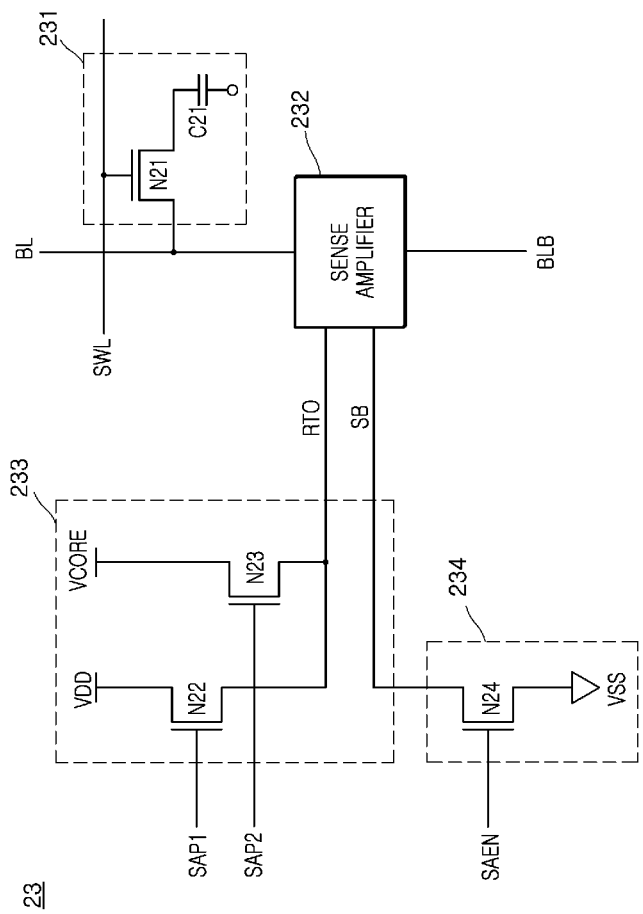
FIG. 3 is a diagram illustrating the configuration of a sense amplifying circuit included in the semiconductor system illustrated in FIG. 1.

Referring to FIG. 3, the sense amplifying circuit 23 may include a memory cell 231, a sense amplifier 232, a first power driving unit 233, and a second power driving unit 234.

The memory cell 231 may include a cell transistor N21 and a cell capacitor C21. In addition, and where a word line SWL is selected and enabled at a logic high level by one of a read operation, a write operation, and a refresh operation, the cell transistor N21 is turned on, and charge sharing may occur between the bit line BL and the cell capacitor C21.

The sense amplifier 232 may receive a supply of a first driving voltage RTO and a second driving voltage SB. The sense amplifier 232 may also sense and amplify a pair of bit lines BL and BLB. More specifically, the sense amplifier 232 may sense a minute voltage difference that occurs between the bit line BL and a complementary bit line BLB due to the charge sharing, and amplify signals of the bit line BL and the complementary bit line BLB.

The first power driving unit 233 may include an NMOS transistor N22 which receives an input of the first power control signal SAP1 and drives the first driving voltage RTO at the level of the first power VDD. The first power driving unit 233 may also include an NMOT transistor N23 which receives an input of the second power control signal SAP2 and drives the first driving voltage RTO at the level of the second power VCORE. The NMOS transistor N22 is turned on during a period in which the first power control signal SAP1 is enabled at a logic high level and drives the first driving voltage RTO at the level of the first power VDD. The NMOS transistor N23 is turned on during a period in which the second power control signal SAP2 is enabled at a logic high level and drives the first driving voltage RTO at the level of the second power VCORE. The first power VDD may be an external voltage supplied from an outside of the semiconductor device 2. Further, the second power VCORE may be an internal voltage supplied to a core region in which the memory cell is formed inside the semiconductor device 2. Further, the first power VDD may be set to a voltage that has a voltage level higher than the voltage level of the second power VCORE.

The second power driving unit 234 may include an NMOS transistor N24 which receives an input of the enable signal SAEN and drives the second driving voltage SB. The NMOS transistor N24 is turned on during a period in which the enable signal SAEN is enabled at a logic high level and drives the second driving voltage SB at the level of a third power VSS. In an embodiment, the NMOS transistor N24 may drive the second driving voltage SB at the level of a back bias voltage VBB. The third power VSS may be an external voltage supplied from the outside of the semiconductor device 2. In addition, the back bias voltage VBB may be an internal voltage generated by voltage pumping inside the semiconductor device 2. The back bias voltage VBB may have a level lower than the level of the third power VSS.

Figure 4:
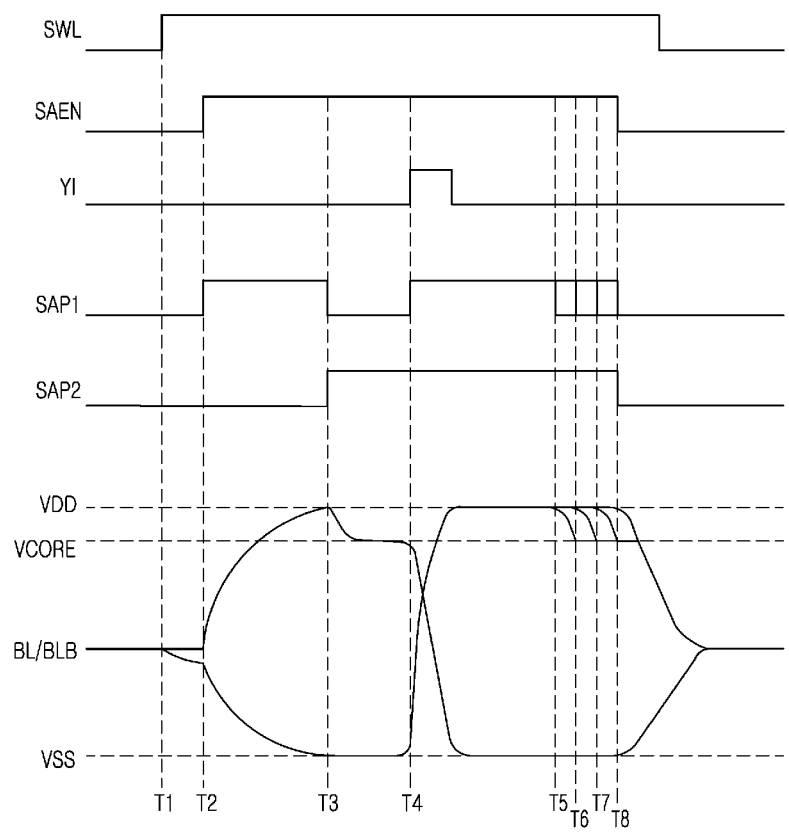
FIG. 4 is a timing diagram explaining the operation of the semiconductor system illustrated in FIG. 1.

Referring to FIG. 4, the operation of the semiconductor system in accordance with an embodiment of the invention will be described. First, an operation of adjusting an overdriving period in accordance with a combination of the first and second test mode signals TM<1:2> will be described.

At time T1, the controller 1 outputs the active command ACT and the first and second test mode signals TM<1:2> to enter the write operation. In this case, the word line SWL that is electrically coupled to the memory cell 231 of the sense amplifying circuit 23 is driven at a logic high level. In addition, the charge sharing occurs between the bit line BL and the cell capacitor C21.

Next, at time T2, the enable signal generation unit 21 of the semiconductor device 2 receives an input of the active command ACT and generates the enable signal SAEN of a logic high level.

The power control signal generation unit 22 receives an input of the enable signal SAEN of a logic high level. The power control signal generation unit 22 also generates the first power control signal SAP1 of a logic high level and the second power control signal SAP2 of a logic low level. The power control signal generator 22 generates the first pulse of the first power control signal SAP1.

The sense amplifying circuit 23 receives an input of the first power control signal SAP1 of a logic high level and the second power control signal SAP2 of a logic low level. The sense amplifying circuit 23 also drives the first driving voltage RTO at the level of the first power VDD. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. The sense amplifying circuit 23 performs overdriving operation for amplifying the bit line BL and the complementary bit line BLB as high as the level difference between the first power VDD and the third power VSS.

Next, at time T3, the power control signal generation unit 22 generates the first power control signal SAP1 disabled at a logic low level after the predetermined time point from the time T2 that is the generation time point of the generated enable signal SAEN of a logic high level. Further, the power control signal generation unit 22 generates the second power control signal SAP2 of a logic high level after the predetermined time point from the time T2 that is the generation time point of the generated enable signal SAEN of a logic high level. In this case, the predetermined time point is set by the delay amount of the delay unit 221.

The sense amplifying circuit 23 receives an input of the first power control signal SAP1 of a logic low level and the second power control signal SAP2 of a logic high level. The sense amplifying circuit 23 also drives the first driving voltage RTO at the level of the second power VCORE. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. The sense amplifying circuit 23 amplifies the bit line BL and the complementary bit line BLB as high as the level difference between the second power VCORE and the third power VSS.

Next, at time T4, the power control signal generation unit 22 receives the enable signal SAEN of a logic high level and the column selection signal YI of a logic high level. The power control signal generation unit 22 also generates the first power control signal SAP1 of a logic high level and the second power control signal SAP2 of a logic high level. The power control signal generation unit 22 generates the second pulse of the first power control signal SAP1.

The sense amplifying circuit 23 receives an input of the first power control signal SAP1 of a logic high level and the second power control signal SAP2 of a logic high level. The sense amplifying circuit 23 also drives the first driving voltage RTO at the level of the first power VDD. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. The sense amplifying circuit 23 performs overdriving operation for amplifying the bit line BL and the complementary bit line BLB as high as the level difference between the first power VDD and the third power VSS.

On the other hand, as illustrated in FIG. 4, the reason why the levels of the bit line BL and the complementary bit line BLB are inverted is that data input from the outside and data of the memory cell 231 have different logic levels.

Next, at time T5, when the combination of the first and second test mode signals TM<1:2> is input as a first combination, the power control signal generation unit 22 generates the first power control signal SAP1 disabled at a logic low level and the second power control signal SAP2 of a logic high level. The time T5 is an overdriving end time where the combination of the first and second test mode signals TM<1:2> is input as the first combination. Further, where the combination of the first and second test mode signals TM<1:2> is the first combination, the first test mode signal TM<1> is of a logic low level and the second test mode signal TM<2> is of a logic low level.

The sense amplifying circuit 23 receives an input of the first power control signal SAP1 of a logic low level and the second power control signal SAP2 of a logic high level. The sense amplifying circuit 23 also drives the first driving voltage RTO at the level of the second power VCORE. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. In this case, the sense amplifying circuit 23 amplifies the bit line BL and the complementary bit line BLB as high as the level difference between the second power VCORE and the third power VSS.

When the combination of the first and second test mode signals TM<1:2> is input as the first combination, the overdriving period is set to the shortest period.

Next, at time T6, where the combination of the first and second test mode signals TM<1:2> is input as a second combination, the power control signal generation unit 22 generates the first power control signal SAP1 that is disabled at a logic low level and the second power control signal SAP2 of a logic high level. The time T6 is an overdriving end time where the combination of the first and second test mode signals TM<1:2> is input as the second combination. Further, where the combination of the first and second test mode signals TM<1:2> is the second combination, the first test mode signal TM<1> is of a logic high level and the second test mode signal TM<2> is of a logic low level.

The sense amplifying circuit 23 receives an input of the first power control signal SAP1 of a logic low level and the second power control signal SAP2 of a logic high level. The sense amplifying circuit 23 also drives the first driving voltage RTO at the level of the second power VCORE. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. In this case, the sense amplifying circuit 23 amplifies the bit line BL and the complementary bit line BLB as high as the level difference between the second power VCORE and the third power VSS.

When the combination of the first and second test mode signals TM<1:2> is input as the second combination, it can be known that the overdriving period is increased in comparison to where the combination of the first and second test mode signals TM<1:2> is input as the first combination.

Next, at time T7, where the combination of the first and second test mode signals TM<1:2> is input as a third combination, the power control signal generation unit 22 generates the first power control signal SAP1 disabled at a logic low level and the second power control signal SAP2 of a logic high level. The time T7 is an overdriving end time where the combination of the first and second test mode signals TM<1:2> is input as the third combination. Further, where the combination of the first and second test mode signals TM<1:2> is the third combination, the first test mode signal TM<1> is of a logic low level and the second test mode signal TM<2> is of a logic high level.

The sense amplifying circuit 23 receives an input of the first power control signal SAP1 of a logic low level and the second power control signal SAP2 of a logic high level. The sense amplifying circuit 23 also drives the first driving voltage RTO at the level of the second power VCORE. Further, the sense amplifying circuit 23 receives an input of the enable signal SAEN of a logic high level and drives the second driving voltage SB at the level of the third power VSS. Further, the sense amplifying circuit 23 amplifies the bit line BL and the complementary bit line BLB. In this case, the sense amplifying circuit 23 amplifies the bit line BL and the complementary bit line BLB as high as the level difference between the second power VCORE and the third power VSS.

When the combination of the first and second test mode signals TM<1:2> is input as the third combination, it can be known that the overdriving period is increased in comparison to where the combination of the first and second test mode signals TM<1:2> is input as the second combination.

Next, at time T8, the enable signal generation unit 21 of the semiconductor device 2 generates the enable signal SAEN of a logic low level through termination of the write operation.

When the enable signal SAEN of a logic low level is input and the combination of the first and second test mode signals TM<1:2> is input as a fourth combination, the power control signal generation unit 22 generates the first power control signal SAP1 disabled at a logic low level and the second power control signal SAP2 disabled at a logic low level. The time T8 is an overdriving end time where the combination of the first and second test mode signals TM<1:2> is input as the fourth combination. Further, where the combination of the first and second test mode signals TM<1:2> is the fourth combination, the first test mode signal TM<1> is of a logic high level and the second test mode signal TM<2> is of a logic high level.

The sense amplifying circuit 23 receives an input of the first power control signal SAP1 of a logic low level and the second power control signal SAP2 of a logic high level. The sense amplifying circuit 23 also does not drive the first driving voltage RTO. Further, the sense amplifying circuit 23 receives an input of the enable signal SAEN of a logic low level and does not drive the second driving voltage SB. Further, the sense amplifying circuit 23 does not amplify the bit line BL and the complementary bit line BLB.

When the combination of the first and second test mode signals TM<1:2> is input as the fourth combination, the overdriving period is set to the longest period.

In accordance with the semiconductor system as configured above, the test mode for adjusting the period in which the power is supplied to the sense amplifier is provided. In addition, the write time can be reduced through adjustment of the overdriving period.

Figure 5:
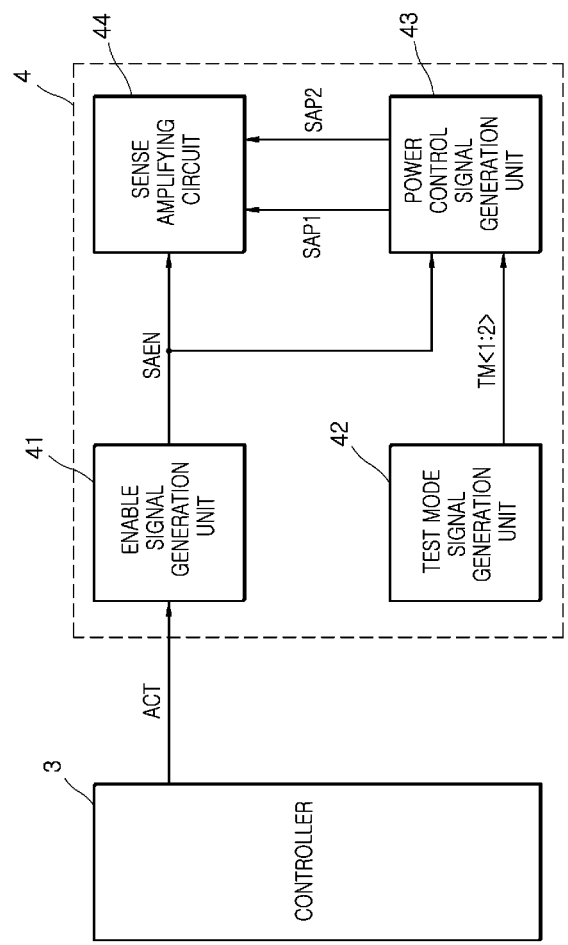
FIG. 5 is a block diagram illustrating the configuration of a semiconductor system in accordance with an embodiment.

Referring to FIG. 5, a block diagram illustrating the configuration of a semiconductor system in accordance with an embodiment is described.

As illustrated in FIG. 5, a semiconductor system in accordance with an embodiment may include a controller 3 and a semiconductor device 4. The semiconductor device 4 may include an enable signal generation unit 41, a test mode signal generation unit 42, a power control signal generation unit 43, and a sense amplifying circuit 44.

The enable signal generation unit 41 may receive an input of an active command ACT. The enable signal generation unit 41 may also generate an enable signal SAEN enabled during a write operation.

The test mode signal generation unit 42 stores first and second test mode signals TM<1:2> and outputs the first and second test mode signals TM<1:2> during the write operation. Here, in accordance with various embodiments, the test mode signal generation unit 42 may be implemented by a volatile memory or a nonvolatile memory that stores the first and second test mode signals TM<1:2>. In the alternative, the test mode signal generation unit 42 may be implemented by a circuit in which a plurality of fuses are programmed to generate the first and second test mode signals TM<1:2>.

The power control signal generation unit 43 may generate a first power control signal SAP1 that includes a first pulse generated when an enable signal SAEN is input and a second pulse of which the pulse width is adjusted in accordance with a combination of the first and second test mode signals TM<1:2> during the write operation. In addition, the power control signal generation unit 43 may also generate a second power control signal SAP2 enabled after a predetermined time point from the generation time point of the enable signal SAEN.

Here, since the power control signal generation unit 43 is implemented by the same circuit as the power control signal generation unit 22 as illustrated in FIG. 2 to perform the same operation, the detailed explanation thereof will be omitted.

The sense amplifying circuit 44 may receive a first power that is driven by the first power control signal SAP1 and a second power that is driven by the second power control signal SAP2 during an enable period of the enable signal SAEN. The sense amplifying circuit 43 may also sense and amplify a pair of bit lines BL and BLB.

Here, since the sense amplifying circuit 44 is implemented by the same circuit as the sense amplifying circuit 23 as illustrated in FIG. 3 to perform the same operation. Accordingly, a detailed explanation thereof will be omitted.

The semiconductor device 4 may generate the first power control signal SAP1 of which the pulse width is adjusted in accordance with the combination of the first and second test mode signals TM<1:2> during the enable period of the enable signal SAEN that is generated by the active command ACT. The semiconductor device 4 may generate the second power control signal SAP2 after the predetermined time point from the generation time point of the enable signal SAEN. In addition, the semiconductor device 4 may sense and amplify the pair of bit lines by the first power that is supplied by the first power control signal SAP1 and the second power that is supplied by the second power control signal SAP2.

In accordance with the semiconductor system as configured above, the test mode for adjusting the period in which the power is supplied to the sense amplifier is provided. Further, the write time can be reduced through adjustment of the overdriving period.

While various embodiments have been described above, it will be understood to those skilled in the art that the embodiments described are by way of examples only. Accordingly, the device and system described should not be limited based on the described embodiments above.

What is claimed is:

1. A semiconductor system comprising:
   a controller configured to output an active command and test mode signals; and
   a semiconductor device configured to sense and amplify a pair of bit lines by generating a first power control signal of which a pulse width is adjusted in accordance with a combination of the test mode signals during an enable period of an enable signal generated by the active command, receiving a supply of a first power according to the first power control signal, and receiving a supply of a second power according to a second power control signal.

2. The semiconductor system of claim 1, wherein the first power control signal includes a first pulse generated when the enable signal is enabled and a second pulse generated during a write operation, and a pulse width of the second pulse is adjusted in accordance with the combination of the test mode signals.

3. The semiconductor system of claim 1, wherein the first power has a voltage level higher than a voltage level of the second power.

4. The semiconductor system of claim 1, wherein the semiconductor device comprises:
   an enable signal generation unit configured to generate the enable signal enabled in response to the active command;
   a power control signal generation unit configured to generate the first power control signal that includes a first pulse generated in response to the enable signal and a second pulse generated in accordance with a combination of a column selection signal and the test mode signal generated during a write operation, and to generate the second power control signal enabled after a predetermined time point from a time point when the enable signal is generated; and
   a sense amplifying circuit configured to sense and amplify the pair of bit lines by receiving a supply of the first power and the second power in response to the first and second power control signals during the enable period of the enable signal.

5. The semiconductor system of claim 4, wherein the power control signal generation unit comprises:
   a delay unit configured to generate an inverted delay signal through inversion delay of the enable signal and to generate a delay signal through delay of the enable signal for a predetermined time;
   a first power control signal generation unit configured to generate the first power control signal which includes the first pulse generated at a time point when the enable signal is enabled and the inverted delay signal is enabled, and the second pulse which is enabled in response to the column selection signal generated during the write operation and of which the pulse width is adjusted in accordance with the combination of the test mode signals; and
   a second power control signal generation unit configured to generate the second power control signal enabled at a time point when the delay signal is enabled in response to the enable signal.

6. The semiconductor system of claim 5, wherein the first power control signal generation unit comprises:
   a first logic unit configured to generate a pre-control signal through buffering of the enable signal where the inverted delay signal is enabled;
   a latch signal generation unit configured to generate a latch signal enabled in response to a write signal and the column selection signal and of which a disable time point is adjusted by a delay amount set in accordance with the combination of the test mode signals; and
   a second logic unit configured to generate the first power control signal in response to the pre-control signal and the latch signal.

7. The semiconductor system of claim 6, wherein the latch signal generation unit comprises:
   a logic element configured to generate a set signal enabled when the write signal and the column selection signal are enabled;
   a delay adjustment unit configured to generate a reset signal through delay of the column selection signal with the delay amount adjusted in accordance with the combination of the test mode signals; and
   a latch unit configured to generate the latch signal enabled in a period from a time point when the set signal is enabled to a time point when the reset signal is enabled.

8. The semiconductor system of claim 4, wherein the sense amplifying circuit comprises:
   a first driving voltage generation unit configured to drive a first driving voltage at a level of the first power in response to the first power control signal and to drive the first driving voltage at a level of the second power in response to the second power control signal;

a second driving voltage generation unit configured to drive a second driving voltage at a level of a third power in response to the enable signal; and a sense amplifier configured to receive a supply of the first driving voltage and the second driving voltage and to sense and amplify the pair of bit lines.

9. A semiconductor device comprising:

a power control signal generation unit configured to generate a first power control signal that includes a first pulse generated according to an enable signal enabled during a write operation and a second pulse generated in accordance with a combination of a column selection signal and a test mode signal generated during the write operation, and to generate a second power control signal enabled after a predetermined time point from a time point when the enable signal is generated; and a sense amplifying circuit configured to sense and amplify a pair of bit lines by receiving a supply of a first power and a second power according to the first and second power control signals during an enable period of the enable signal.

10. The semiconductor device of claim 9, wherein the first power has a voltage level higher than a voltage level of the second power.

11. The semiconductor device of claim 9, wherein the power control signal generation unit comprises:

a delay unit configured to generate an inverted delay signal through inversion delay of the enable signal and to generate a delay signal through delay of the enable signal for a predetermined time;

a first power control signal generation unit configured to generate the first power control signal which includes the first pulse generated at a time point when the enable signal is enabled and the inverted delay signal is enabled, and the second pulse which is enabled in response to the column selection signal generated during the write operation and of which the pulse width is adjusted in accordance with the combination of the test mode signals; and a second power control signal generation unit configured to generate the second power control signal enabled at a time point when the delay signal is enabled in response to the enable signal.

12. The semiconductor device of claim 11, wherein the first power control signal generation unit comprises:

a first logic unit configured to generate a pre-control signal through buffering of the enable signal where the inverted delay signal is enabled;

a latch signal generation unit configured to generate a latch signal enabled in response to a write signal and the column selection signal and of which a disable time point is adjusted by a delay amount set in accordance with the combination of the test mode signals; and a second logic unit configured to generate the first power control signal in response to the pre-control signal and the latch signal.

13. The semiconductor device of claim 12, wherein the latch signal generation unit comprises:

a logic element configured to generate a set signal enabled when the write signal and the column selection signal are enabled;

a delay adjustment unit configured to generate a reset signal through delay of the column selection signal with the delay amount adjusted in accordance with the combination of the test mode signals; and a latch unit configured to generate the latch signal enabled in a period from a time point when the set signal is enabled to a time point when the reset signal is enabled.

14. The semiconductor device of claim 9, wherein the sense amplifying circuit comprises:

a first driving voltage generation unit configured to drive a first driving voltage at a level of the first power in response to the first power control signal and to drive the first driving voltage at a level of the second power in response to the second power control signal;

a second driving voltage generation unit configured to drive a second driving voltage at a level of a third power in response to the enable signal; and a sense amplifier configured to receive a supply of the first driving voltage and the second driving voltage and to sense and amplify the pair of bit lines.

15. A semiconductor device comprising:

a test mode signal generation unit configured to store a plurality of test mode signals and to output the test mode signals during a write operation;

a power control signal generation unit configured to generate a first power control signal that includes a first pulse generated according to an enable signal enabled during the write operation and a second pulse generated in accordance with a combination of a column selection signal and the test mode signals generated during the write operation, and to generate a second power control signal enabled after a predetermined time point from a time point when the enable signal is generated; and a sense amplifying circuit configured to sense and amplify a pair of bit lines by receiving a supply of a first power and a second power according to the first and second power control signals during an enable period of the enable signal.

16. The semiconductor device of claim 15, wherein the first power has a voltage level higher than a voltage level of the second power.

17. The semiconductor device of claim 15, wherein the power control signal generation unit comprises:

a delay unit configured to generate an inverted delay signal through inversion delay of the enable signal and to generate a delay signal through delay of the enable signal for a predetermined time;

a first power control signal generation unit configured to generate the first power control signal which includes the first pulse generated at a time point when the enable signal is enabled and the inverted delay signal is enabled, and the second pulse enabled in response to the column selection signal generated during the write operation and of which the pulse width is adjusted in accordance with the combination of the test mode signals; and a second power control signal generation unit configured to generate the second power control signal enabled at a time point when the delay signal is enabled in response to the enable signal.

18. The semiconductor device of claim 17, wherein the first power control signal generation unit comprises:

a first logic unit configured to generate a pre-control signal through buffering of the enable signal when the inverted delay signal is enabled;

a latch signal generation unit configured to generate a latch signal enabled in response to a write signal and the column selection signal and of which a disable time point is adjusted by a delay amount set in accordance with the combination of the test mode signals; and a second logic unit configured to generate the first power control signal in response to the pre-control signal and the latch signal.

19. The semiconductor device of claim 18, wherein the latch signal generation unit comprises:
a logic element configured to generate a set signal enabled when the write signal and the column selection signal are enabled;
a delay adjustment unit configured to generate a reset signal through delay of the column selection signal with the delay amount adjusted in accordance with the combination of the test mode signals; and
a latch unit configured to generate the latch signal enabled in a period from a time point when the set signal is enabled to a time point when the reset signal is enabled.

20. The semiconductor device of claim 15, wherein the sense amplifying circuit comprises:
a first driving voltage generation unit configured to drive a first driving voltage at a level of the first power in response to the first power control signal and to drive the first driving voltage at a level of the second power in response to the second power control signal;
a second driving voltage generation unit configured to drive a second driving voltage at a level of a third power in response to the enable signal; and
a sense amplifier configured to receive a supply of the first driving voltage and the second driving voltage and to sense and amplify the pair of bit lines.

21. The semiconductor device of claim 15, wherein the power control signal generation unit is configured to generate the second pulse of which the pulse width is adjusted according to a combination of first and second test mode signals.

22. The semiconductor device of claim 21, wherein the test mode signal generation unit is configured to store the first and second test mode signals and output the first and second test mode signals.

23. The semiconductor device of claim 15, wherein the power control signal generation unit is configured to generate the first power control signal with a pulse width adjusted according to a first test mode signal and a second test mode signal during the enable period of the enable signal.

24. The semiconductor device of claim 15, wherein the power control signal generation unit is configured to generate the second power control signal after the predetermined time point from a generation time point of the enable signal.

25. The semiconductor device of claim 15, wherein a test mode for adjusting a period in which power is supplied to the sense amplifying circuit is provided.

26. The semiconductor device of claim 15, wherein the test mode signal generation unit includes a nonvolatile memory configured to store a first test mode signal and a second test mode signal.

27. The semiconductor device of claim 15, wherein the test mode signal generation unit includes a plurality of fuses configured to generate a first test mode signal and a second test mode signal.

28. The semiconductor device of claim 15, wherein the test mode signal generation unit includes a volatile memory configured to store a first test mode signal and a second test mode signal.

* * * * *